US012562200B2

(12) United States Patent
Erbagci et al.

(10) Patent No.: US 12,562,200 B2
(45) Date of Patent: Feb. 24, 2026

(54) SHARED METAL WIRE CAPACITANCE FOR NEGATIVE BIT-LINE

(71) Applicant: NVIDIA Corp., Santa Clara, CA (US)

(72) Inventors: Cagri Erbagci, Pittsburgh, PA (US); Burak Erbagci, Pittsburgh, PA (US); Lalit Gupta, Fremont, CA (US); Jesse San-Jey Wang, Santa Clara, CA (US)

(73) Assignee: NVIDIA Corp., Santa Clara, CA (US)

( * ) Notice: Subject to any disclaimer, the term of this patent is extended or adjusted under 35 U.S.C. 154(b) by 201 days.

(21) Appl. No.: 18/336,758

(22) Filed: Jun. 16, 2023

(65) Prior Publication Data

US 2024/0420748 A1 Dec. 19, 2024

(51) Int. Cl.
G11C 7/12 (2006.01)
G11C 7/10 (2006.01)
(52) U.S. Cl.
CPC .............. G11C 7/12 (2013.01); G11C 7/1096 (2013.01)
(58) Field of Classification Search
CPC ................................ G11C 7/12; G11C 7/1096
See application file for complete search history.

(56) References Cited

U.S. PATENT DOCUMENTS

| | | | |
|---|---|---|---|
| 9,916,892 B1* | 3/2018 | Raj ........................ | G11C 11/419 |
| 10,217,507 B2* | 2/2019 | Bringivijayaraghavan ................. | G11C 7/22 |
| 2007/0268738 A1* | 11/2007 | Heinrich-Barna .... | G11C 11/412 365/149 |
| 2011/0235444 A1* | 9/2011 | Chuang ................. | G11C 11/413 365/189.16 |
| 2013/0039120 A1* | 2/2013 | Moriwaki ............. | G11C 11/419 365/154 |
| 2015/0206576 A1* | 7/2015 | Gong ........................ | G11C 7/12 365/154 |
| 2017/0117034 A1* | 4/2017 | Hebig ................... | G11C 11/419 |
| 2023/0274769 A1* | 8/2023 | Akkaya .................. | H10B 10/18 |

* cited by examiner

*Primary Examiner* — Khamdan N. Alrobaie
(74) *Attorney, Agent, or Firm* — Carnelian Law, LLC

(57) ABSTRACT

Negative bit line voltage assist mechanisms for multi-bank machine memories utilizing multiple local IO drivers include a shared boost capacitor configured to generate a negative bit line voltage assist for write operations by local IO drivers, where the boost capacitor is configured to selectively couple to one of the local IO drivers during the write operation.

20 Claims, 12 Drawing Sheets

SHARED METAL WIRE CAPACITANCE FOR NEGATIVE BIT-LINE

BACKGROUND

Machine memory mechanisms that utilize a negative bit line voltage assist for writing bits to the memory conventionally utilize a boost capacitor on each local (to each one or a few memory banks) input/output (IO) stage. Memories utilizing multiple local IO (LIO) stages typically utilize a boost capacitor in each LIO. Only one LIO is activate during a particular write operation, with the others remaining idle.

A typical integrated circuit implementing machine memory circuits comprises a semiconductor substrate where active devices are formed. Above the substrate is an insulation layer, and then multiple metal layers separated by interlayer insulating layers. Portions of the metal layers are coupled together, and to the active devices, by vias through the insulating layers. Capacitor structures may be formed using the metal layers or active devices, or both.

A boost capacitor may be formed by routing substantially parallel metal tracks through the memory with oxide, polysilicon, or other insulating material in between the tracks. Conventionally, the number of occupied metal tracks utilized for this purpose increases linearly with the number of LIOs in the memory. This burdens the availability of metal track resources for other purposes, such as global interconnects and power nets for the memory, and also complicates the metal routing. If a particular memory mechanism design constrains usage of certain (e.g., the top) metal layers for particular purposes, the available metal resources for implementing metal track capacitors becomes even more restrictive.

One conventional manner of dealing with these issues is to curtail the metal utilized to route power rails, and/or to decrease the widths of metal interconnects to make room for the fabrication of metal tack boost capacitors. These tradeoffs may come at the expense of degraded parasitic current/resistance (IR) drop margins and degraded write time performance. In some designs these metal trade-offs are not even practical. In such cases the boost capacitors may be formed using metal-oxide-silicon (MOS) mechanisms, at the expense of consuming additional die area over metal track boost capacitor mechanisms.

Solutions to these issues that do not degrade performance of the bit lines, for example by adding loading and/or parasitic effects to the bit lines, have proven to be difficult and elusive.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Mechanisms are described to decrease overall metal resource usage when implementing capacitors for negative bit line voltage assist. Implementations in accordance with these mechanisms may decrease metal resource consumption by boost capacitors without substantially degrading performance of the bit lines through additional loading and/or parasitic effects (e.g., by degrading the IR drop margin).

Figure 1:
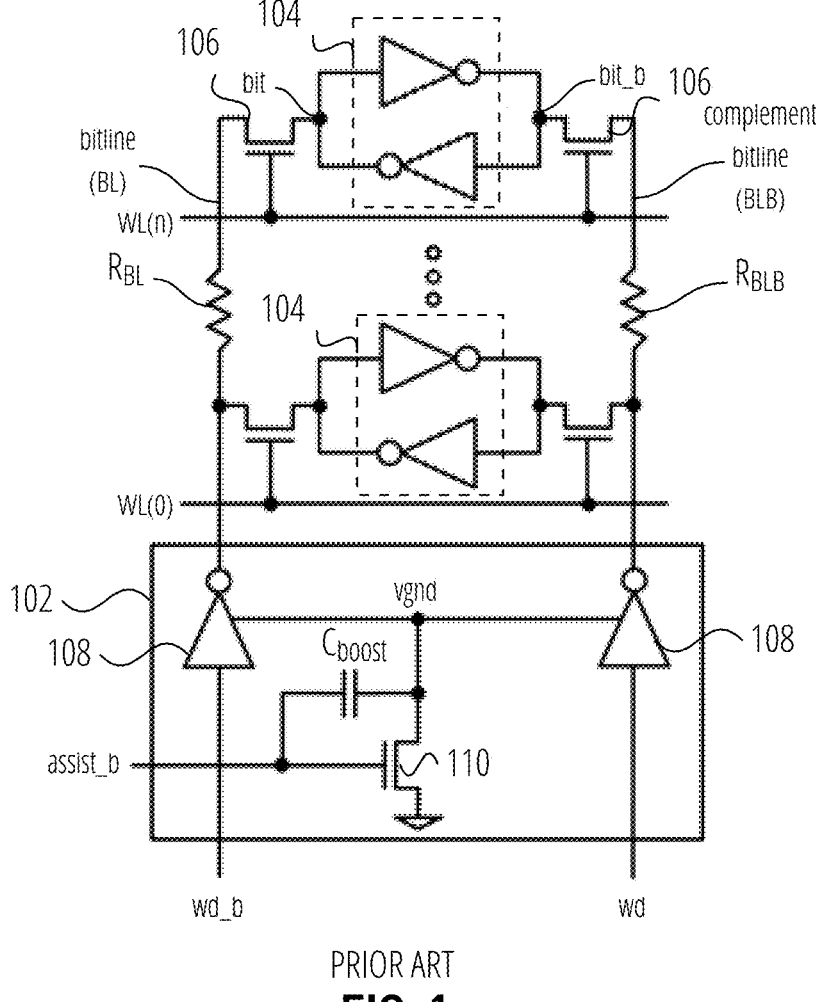
FIG. 1 depicts a machine memory and conventional write driver.

FIG. 1 depicts a machine memory utilizing a conventional local IO driver 102. The machine memory comprises, in part, a stack of bit-storing cells 104 arranged along bit lines (bit line BL and complement bit line BLB). Bit values are written into and read out of the bit-storing cells 104 via the bit cell access transistors 106 to the bit lines. The row for a particular bit-storing cell 104 to write or read is selected by asserting one of the word lines WL(0)-WL(n). Herein, any signal or trace notation ending in "b" or "B" should be understood to mean the complement of a signal or trace of the same name but without the terminal "b" or "B".

The depicted memory technology and bit-storing cells 104 are examples. The mechanisms described herein are not limited to use with memories of the type depicted in FIG. 1.

Data is written to one of the bit-storing cells 104 by asserting the corresponding word line and appropriately setting wd (and wd_b) depending on whether a "1" or a "0" is to be written into the bit-storing cell 104. To make the process of writing bits more efficient, especially at low supply voltages, a "boost" may be applied to the ground (VSS) supply terminals vgnd of the bit line drivers 108. When (wd) is asserted (driven high), a boost signal (assist_b) is asserted (driven low) and applied to a capacitor ($C_{boost}$) and transistor 110, driving vgnd to a lower potential. The negative boost on the VSS terminals of the bit line drivers 108 causes an increases in the driving strength of the bit cell access transistors 106.

This "boost" temporarily pulls node (vgnd) below its nominal ground operating potential, improving the performance of the bit cell access transistors 106 for writing the bit value in the bit-storing cell 104. The capacitor $C_{boost}$ may be fabricated as a Metal-Oxide-Semiconductor (MOS) structure, adding to the die area taken up by the local IO driver 102.

This process may perform well for bit-storing cells 104 along word lines closer to the local IO driver 102. However for bit-storing cells 104 along word lines more distal along the bit lines from the local IO driver 102, the effectiveness of the boost may degrade due to factors such as the IR drop induced by the parasitic resistances $R_{BL}$ and $R_{BLB}$ along the bitlines BL and BLB, respectively.

Figure 2:
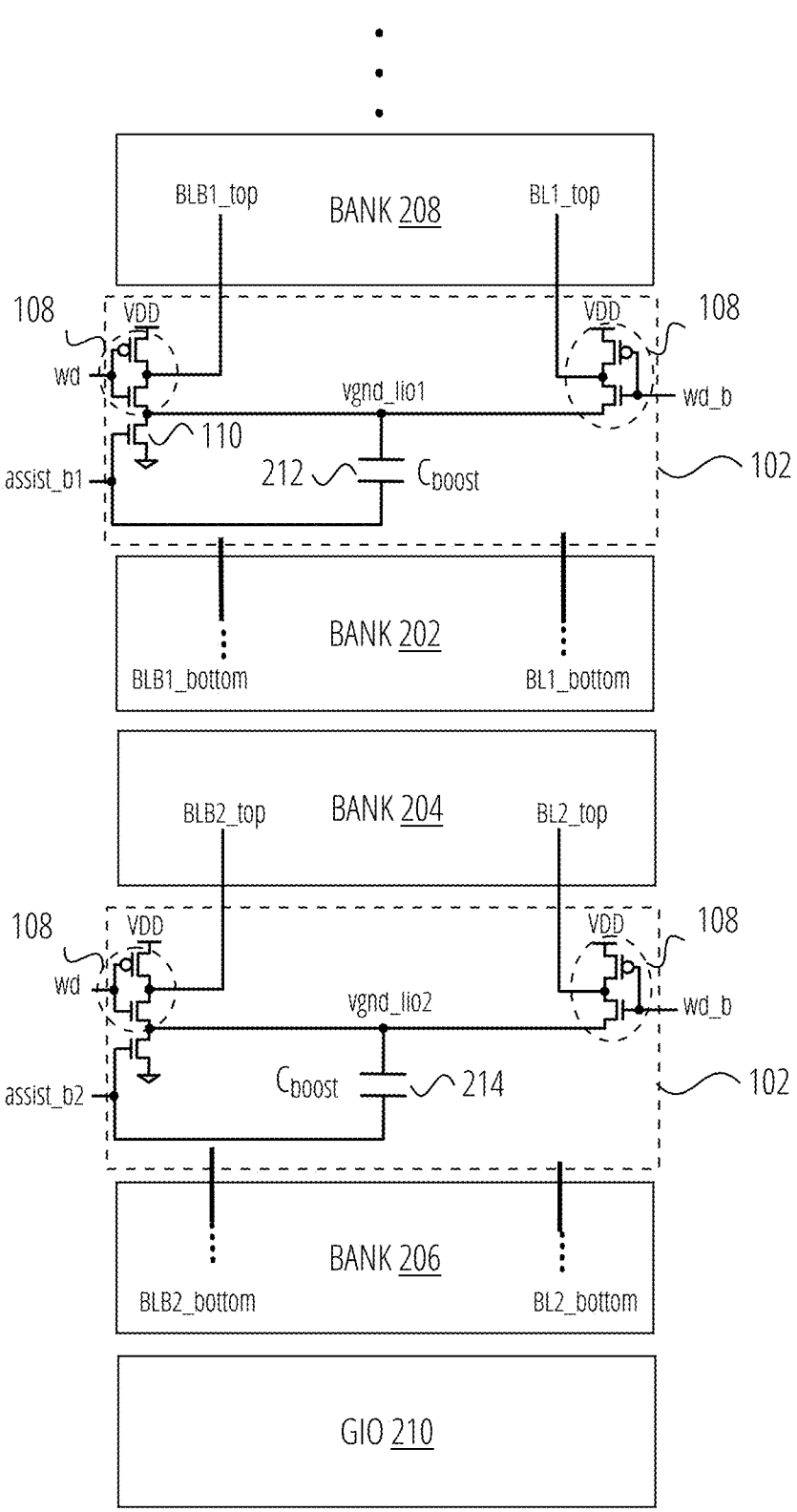
FIG. 2 depicts an example of a conventional memory implementation utilizing bit lines traversing multiple memory banks.

FIG. 2 depicts an example of a conventional multi-bank memory system utilizing a plurality of local IO drivers 102 and local bit lines. 202, 204, 206, 208. In this example, each local IO driver 102 drives a bit line that is local to (does not extend beyond) a pair of the memory banks 202, 204, 206, 208. The local IO drivers 102 share common IO logic 210 and each of the local IO drivers 102 comprises a boost capacitor 212, 214.

In some memory technologies, a local bit line may extend through more than two memory banks, but generally less than all of the memory banks in the memory.

Figure 3A:
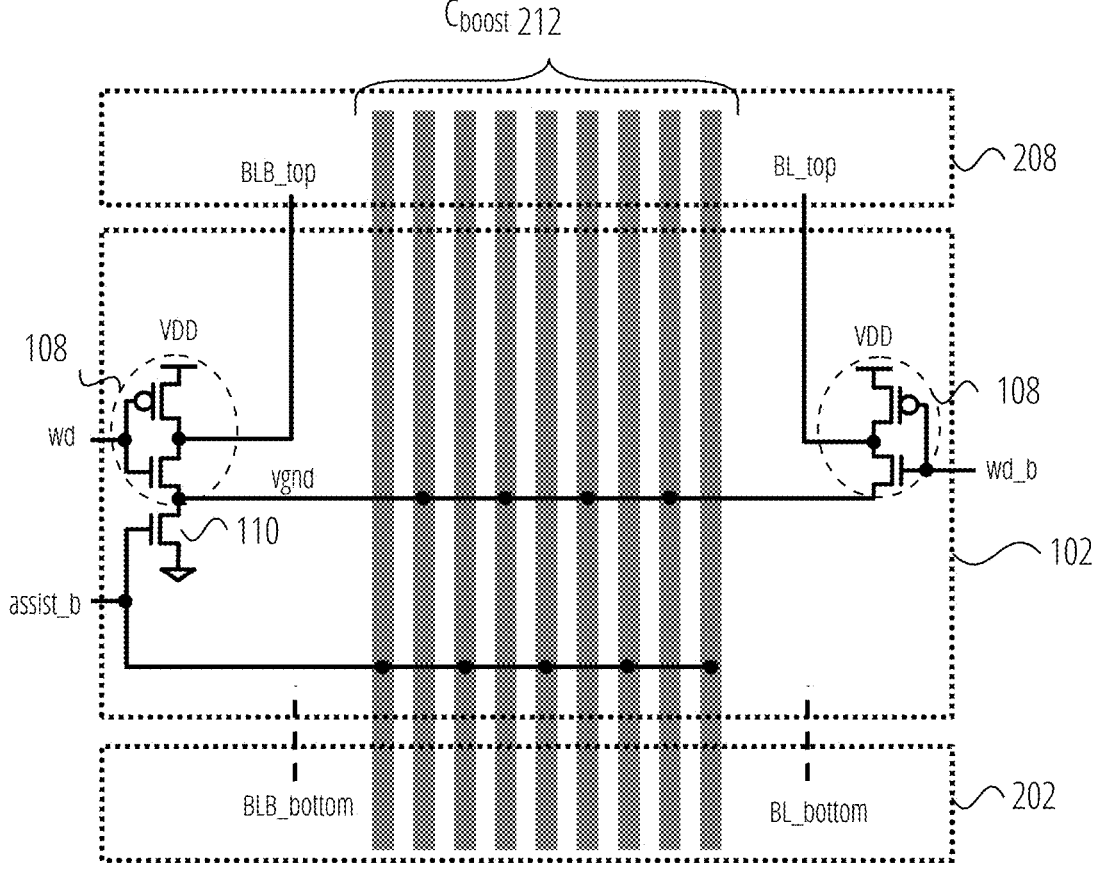
FIG. 3A depicts a conventional metal track boost capacitor implementation.

FIG. 3A depicts a conventional metal track boost capacitor implementation. The boost capacitor 212 comprises a number of substantially parallel metal tracks (shaded bars) interspersed with oxide, polysilicon, or other insulating material (light spaces between the shaded bars). During a write operation, a negative bit line voltage assist signal (assist_b) is applied to a gate of transistor 110 and to a first subset of the metal tracks through transistor 110. A second subset of the metal tracks are coupled to the vgnd (VSS) terminals of the bit line drivers 108. Asserting assist_b generates a negative bit line voltage assist on the local bit lines that increases the driving strength of the bit cell access transistors 106 used to write a bit into the bit-storing cell 104.

Figure 3B:
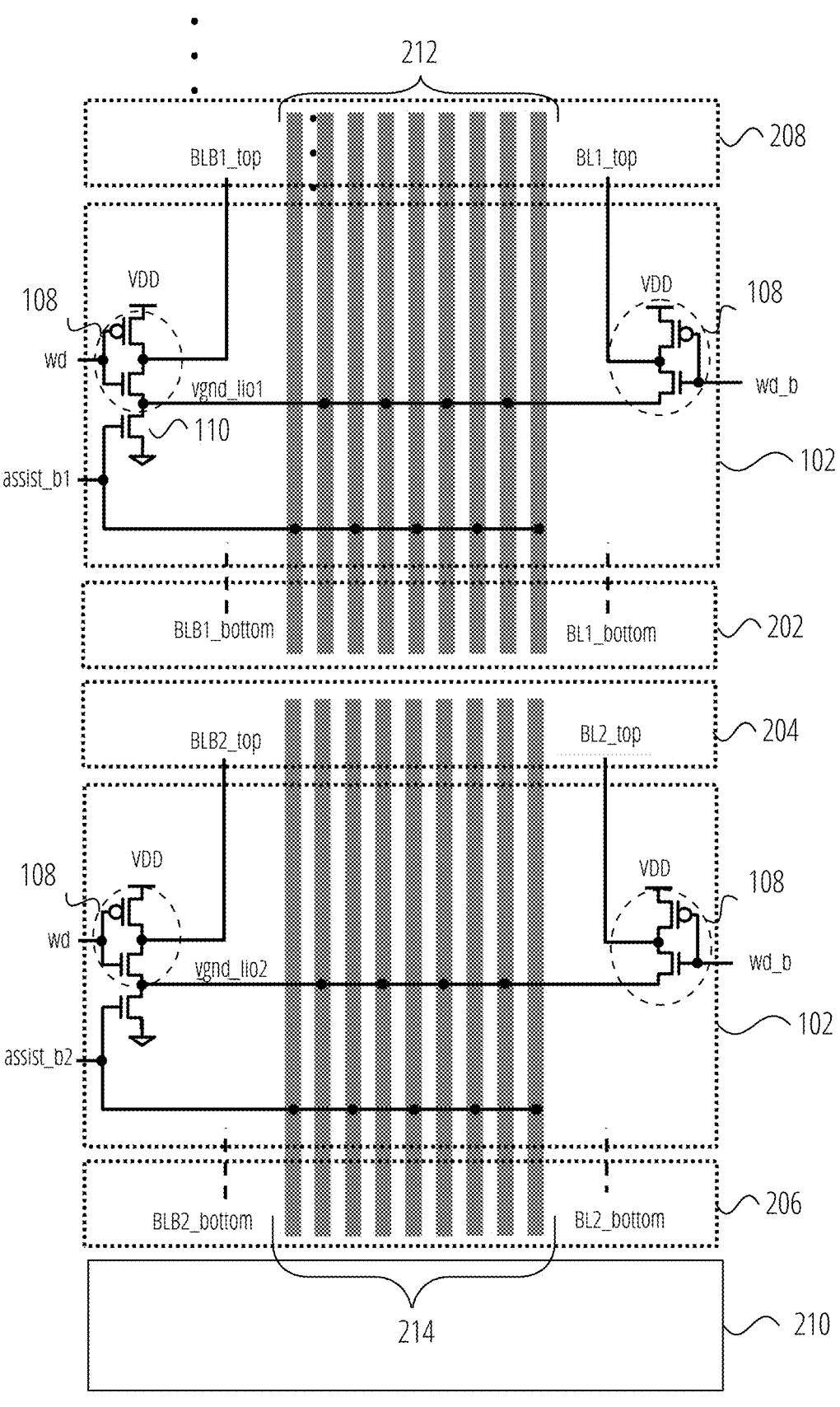
FIG. 3B depicts conventional metal track boost capacitors implemented in multiple local IO drivers of a multi-bank machine memory.

FIG. 3B depicts conventional metal track boost capacitors 212, 214 implemented in multiple local IO drivers 102 of a multi-bank machine memory. The boost capacitors 212, 214 of the local IO drivers 102 do not share metal tracks. In the depicted example, a total of eighteen individual metal tracks, nine per device, are utilized to implement two boost capacitors, each for use in a different local IO driver.

Joining the metal tracks from the upper and lower boost capacitors to form a single boost capacitor shared by both local IO drivers 102 is not practical in this design, due to the interference it would cause with the independent operability of the local IO drivers 102. Furthermore, the design is not readily or intuitively adaptable to enable such individualized access to a shared boost capacitor without introducing additional parasitic effects and loading that degrades performance of the bit lines.

Another constraint that complicates the implementation of a shared metal track capacitor in conventional designs is that the width of the local IO drivers 102 is typically constrained for layout and fabrication reasons and cannot be readily increased. Any additional logic or adaptations to enable a shared metal track boost capacitor among the local IO drivers 102 must typically respect this layout constraint on the width of the local IO drivers 102.

Figure 4A:
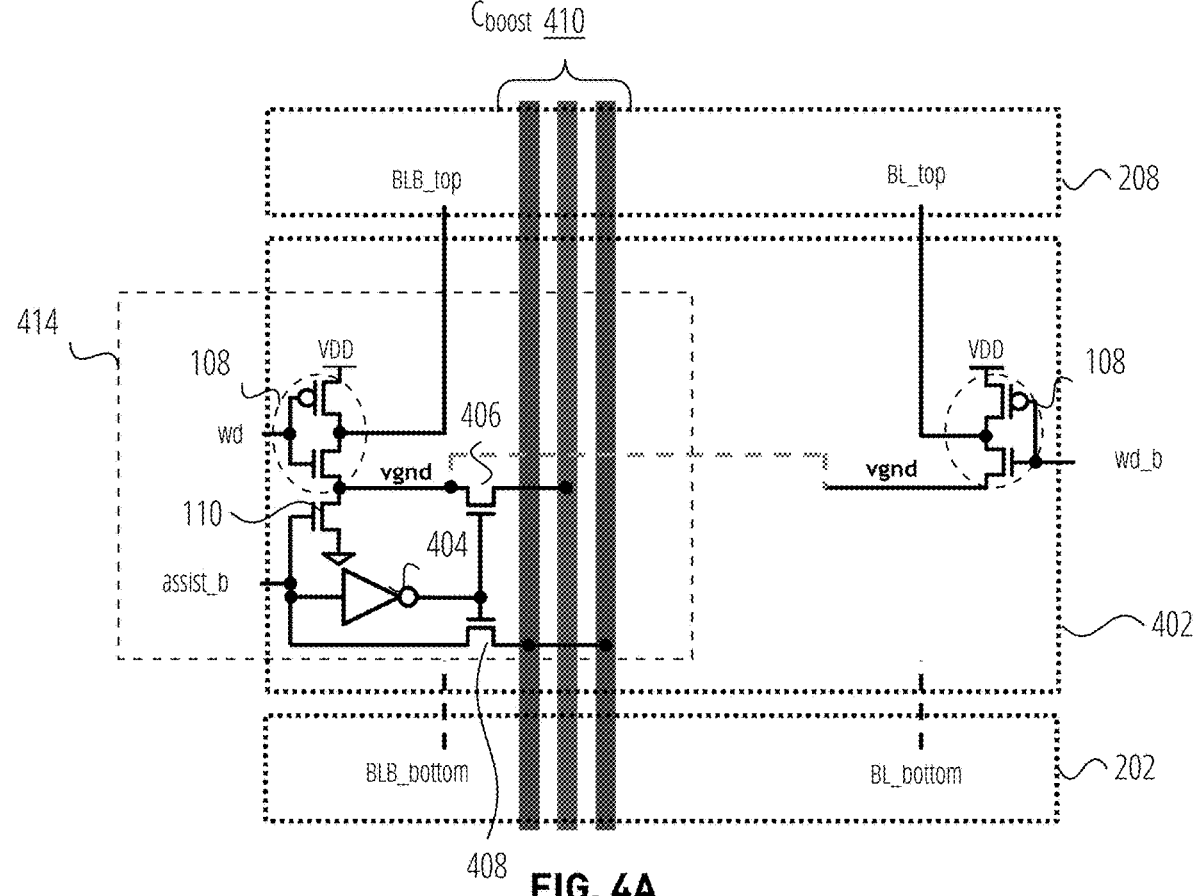
FIG. 4A depicts an embodiment of a negative bit line voltage assist circuit.

FIG. 4A depicts an embodiment of a negative bit line voltage assist circuit 414. The local IO driver 402 comprises a negative bit line voltage assist circuit 414 comprising inverter 404, transistor 406, and transistor 408. When the signal assist_b is asserted (active low), the metal track boost capacitor 410 is coupled to provide the negative potential boost at vgnd during a write operation. Counterintuitively, the threshold voltage drops incurred by one or both of the transistors 406, 408 may not degrade the boost efficacy to vgnd, and the impact of the voltage threshold drops of these transistors on the boost effect may actually decrease in local IO drivers positioned at further distances from the common IO logic 210 along the metal tracks of the boost capacitor, which are extended in length as compared to conventional boost mechanisms (see FIG. 4B). In some embodiments, one or both of the transistors 406, 408 may be configured with a decreasing threshold voltage at further distances from the common IO logic 210.

Figure 4B:
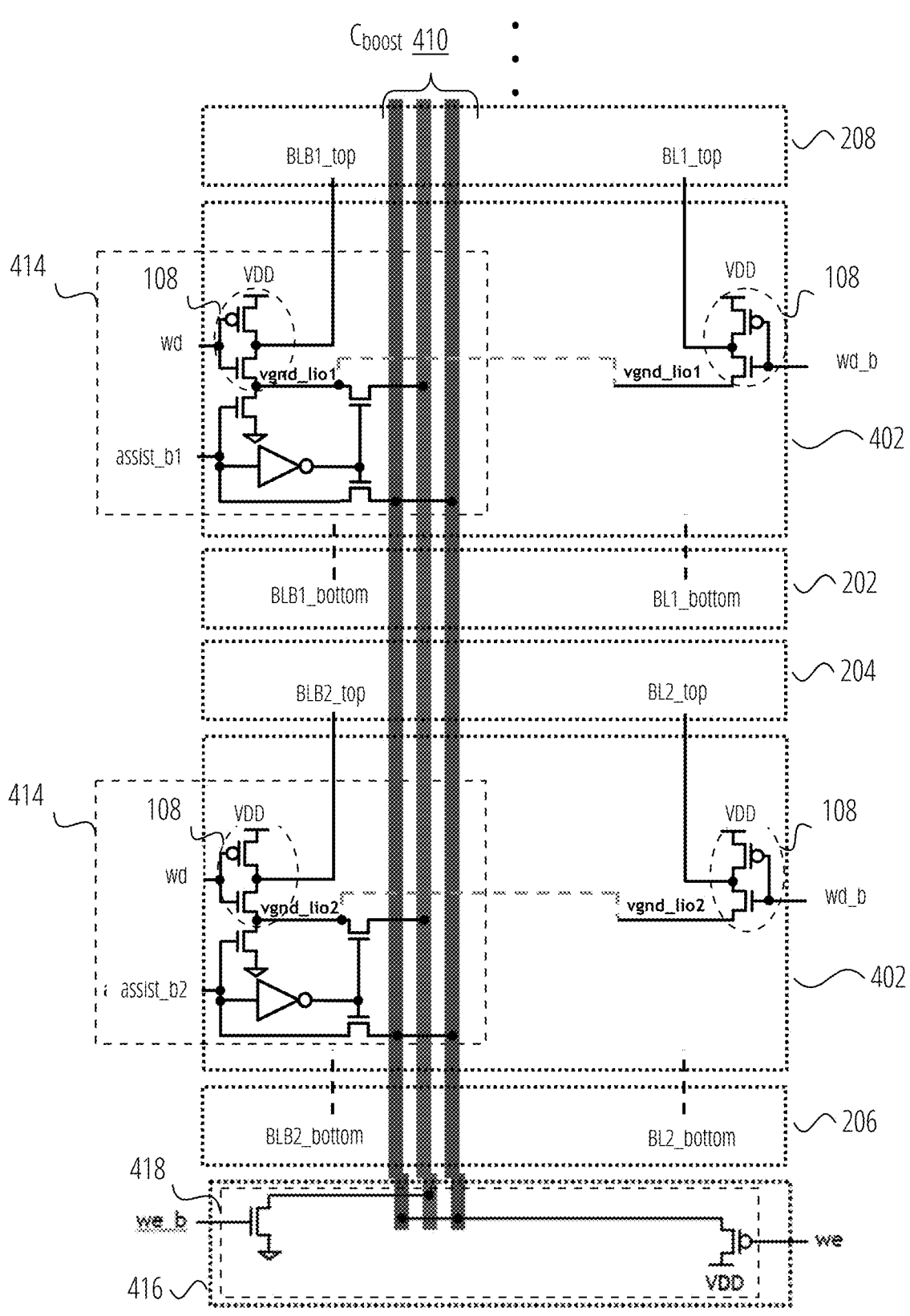
FIG. 4B depicts a shared metal track boost capacitor implemented in multiple local IO drivers of a multi-bank machine memory, in one embodiment.

FIG. 4B depicts an embodiment of a machine memory comprising multiple local IO drivers 402 each comprising a negative bit line voltage assist circuit 414 utilizing a shared boost capacitor 410. Separate boost capacitors for each of the local IO drivers 402 are obviated (no longer utilized) in this embodiment. The shared boost capacitor 410 comprises metal tracks that traverse the multiple local IO drivers 402 and multiple memory banks. The longer length of the metal tracks enables the capacitive boost effect with fewer individual metal tracks than in conventional mechanisms.

There is a substantial reduction in the number of individual metal tracks utilized, and in the total metal resources utilized overall. In this example, three individual metal tracks are utilized to implement one boost capacitor 410 that is shared among the local IO drivers 402 (vs eighteen individual metal tracks in the conventional example). The reduction in metal utilization and number of individual tracks may enable the boost capacitor 410 to be implemented entirely on a lower metal layer of the integrated circuit than with the conventional approach, simplifying routing and freeing metal resources in the higher metal layers for other uses.

For a particular write operation to the memory banks, only one of the local IO drivers 402 is activated. The local IO drivers 402 each comprise a negative bit line voltage assist circuit 414 to selectively apply the (assist_bx) boost signal and boost capacitor 410 to a particular local bit line and bit line drivers 108 in accordance with the manners described above.

A single boost capacitor 410 is shared among and spans multiple local IO driver 402 and memory banks. The use of MOS caps may be obviated (unless a hybrid implementation is utilized, see FIG. 4C-FIG. 4E), and fewer metal tracks are utilized than in conventional mechanisms to implement the boost capacitor 410 for multiple local IO drivers 402, preserving metal resources for other uses.

The memory further comprises common IO logic 416 comprising pre-charge logic 418 for the metal tracks of the boost capacitor 410. The pre-charge logic 418 in this embodiment is external to the local IO drivers 402 and located in the common IO logic 416. The pre-charge logic 418 controls the pre-charge of voltages on the metal tracks of the boost capacitor 410 in preparation of a negative bit line voltage assist.

Particularly, pre-charging may involve asserting the bit line driver signal (wd) followed by the write enable (we) signal, followed by the boost signal (assist_bx, where x is the number of a particular local IO driver). During pre-charge, the global ground rail (gvgnd) is pulled to ground (GND) potential, and the global negative bit line voltage assist rails (gassist_b) are floated, initially at the supply voltage potential (VDD). Upon application of the negative bit line voltage assist, the ground supply for the drivers of a particular local IO driver is pulled below nominal ground potential from which it then relaxes back to nominal ground potential. The ground supply for the drivers of local IO drivers other than the selected one (x) is substantially unaffected (not boosted).

In the depicted embodiment the metal tracks traverse from the common IO logic 416 through two local IO drivers 402 and several memory banks. Generally, the length of the metal tracks, and/or the number of metal tracks, and their thickness and spacing, may be determined by the capacitance needed for the particular memory technology and architecture, and other design constraints (e.g., routing constraints, constraints on utilization of certain metal layers, standard cell layout constraints, etc.) commonly known and understood in the art.

Figure 4C:
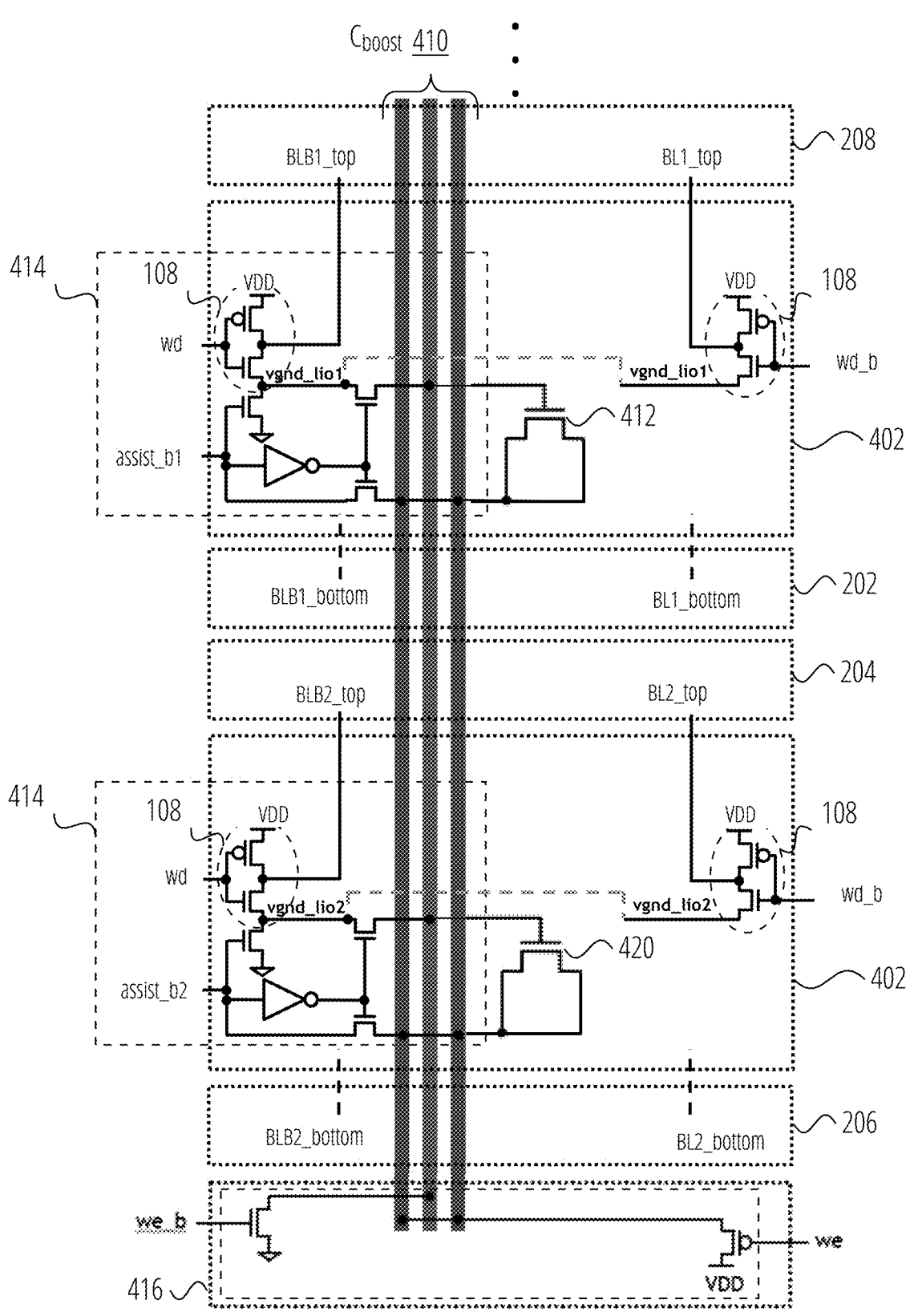
FIG. 4C-FIG. 4E depict hybrid embodiments utilizing a shared metal track boost capacitor and one or more MOS capacitors in local IO drivers and/or common IO logic of a multi-bank machine memory.
Figure 4D:
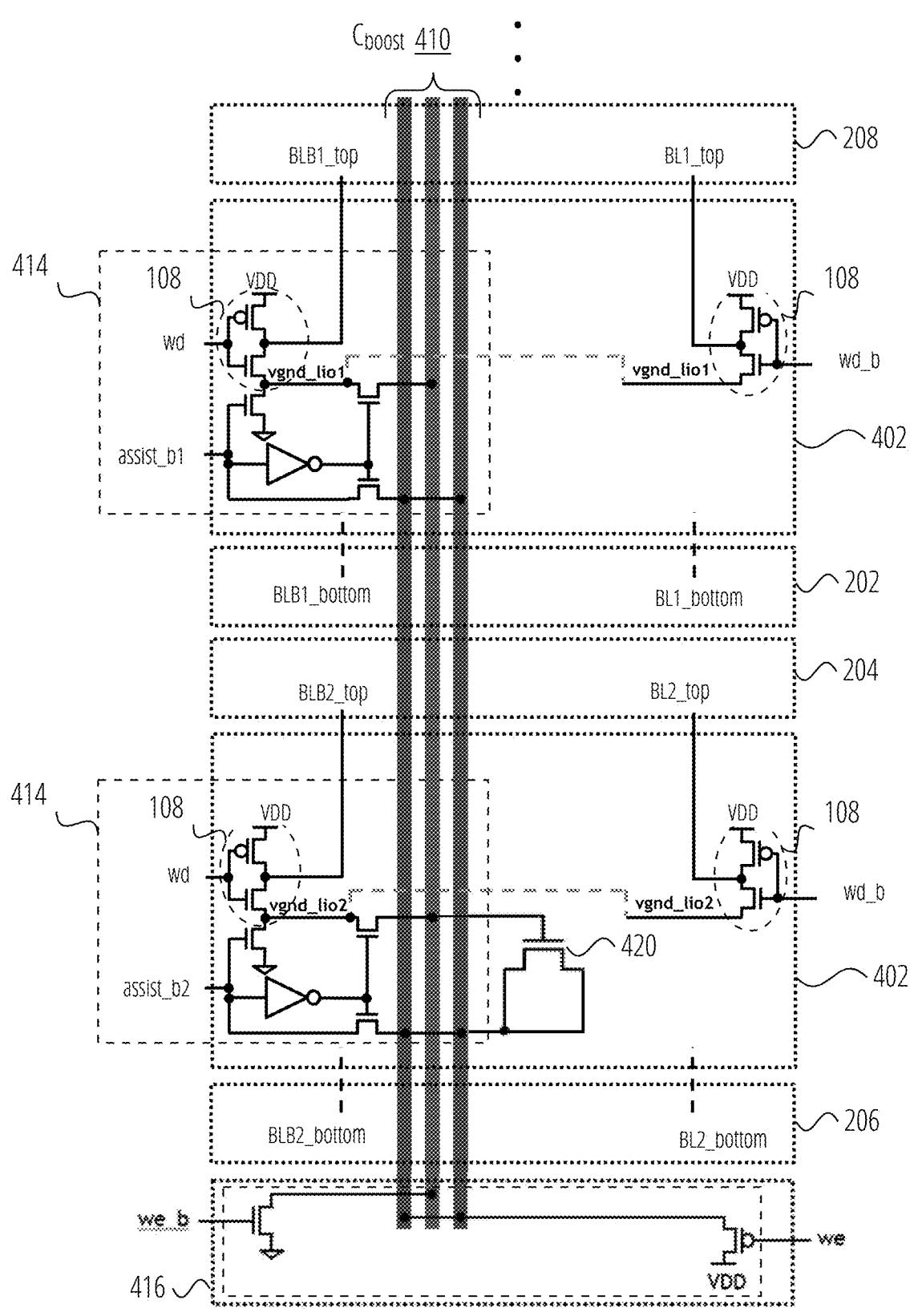
Figure 4E:
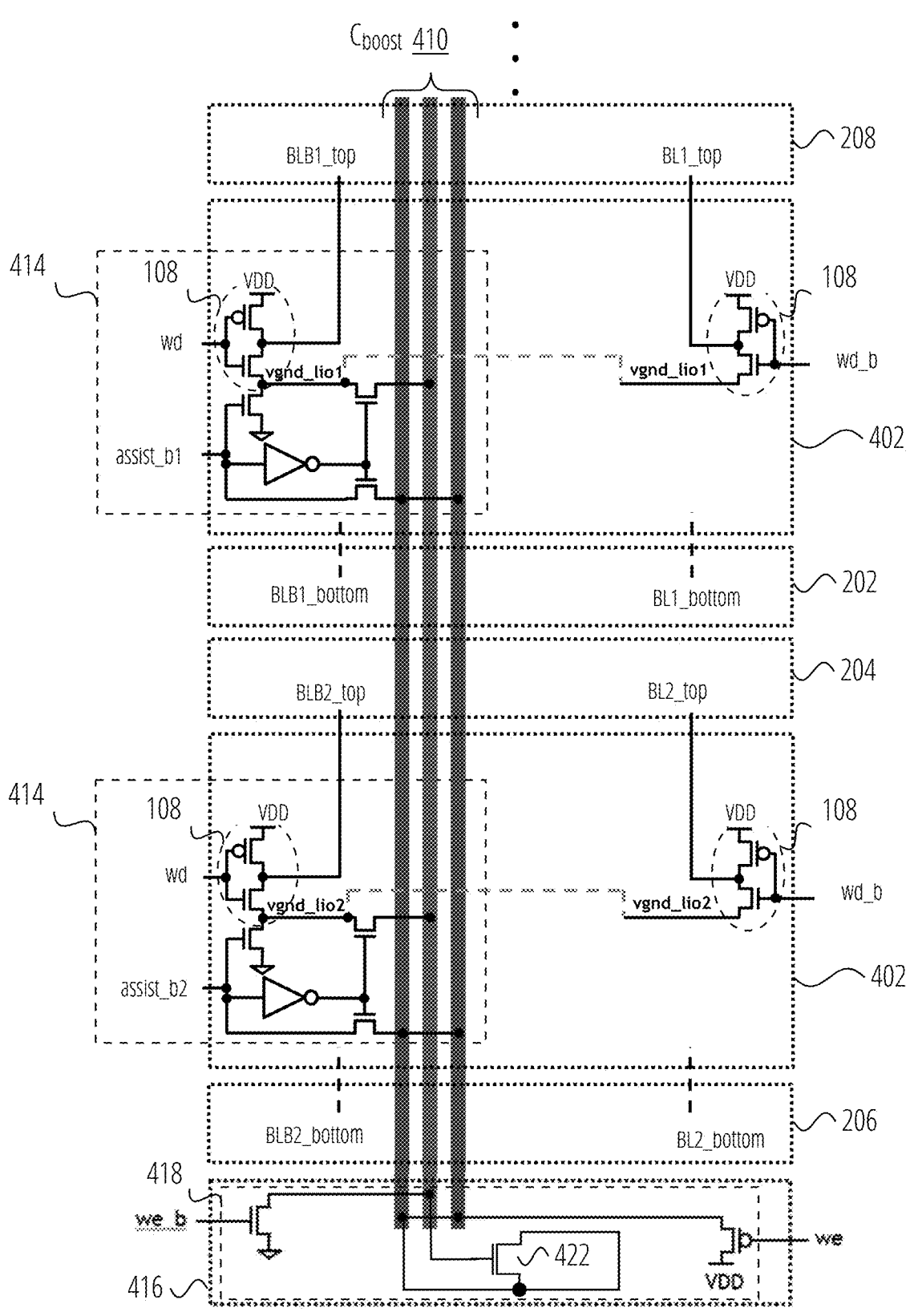

The length of the metal tracks may be set to configure the capacitance best suited to the particular memory technology and implementation. The capacitance generated by the metal tracks may in some hybrid embodiments be supplemented with one or more MOS capacitors 412, as depicted in FIG. 4C. A MOS capacitor structure may comprise a conductive gate of a MOS Field Effect Transistor (MOSFET) formed on an insulator above a channel between a source and a drain of the MOSFET transistor. The gate forms one plate of the capacitor and the channel/source/drain form the other plate of the capacitor, with the two plates separated by the insulator. The one or more MOS capacitors may be disposed in one (or more, see FIG. 4D and MOS capacitor 420) of the local IO drivers 402, for example, and/or in the common IO logic 210 (see FIG. 4E and MOS capacitor 422).

Figure 5:
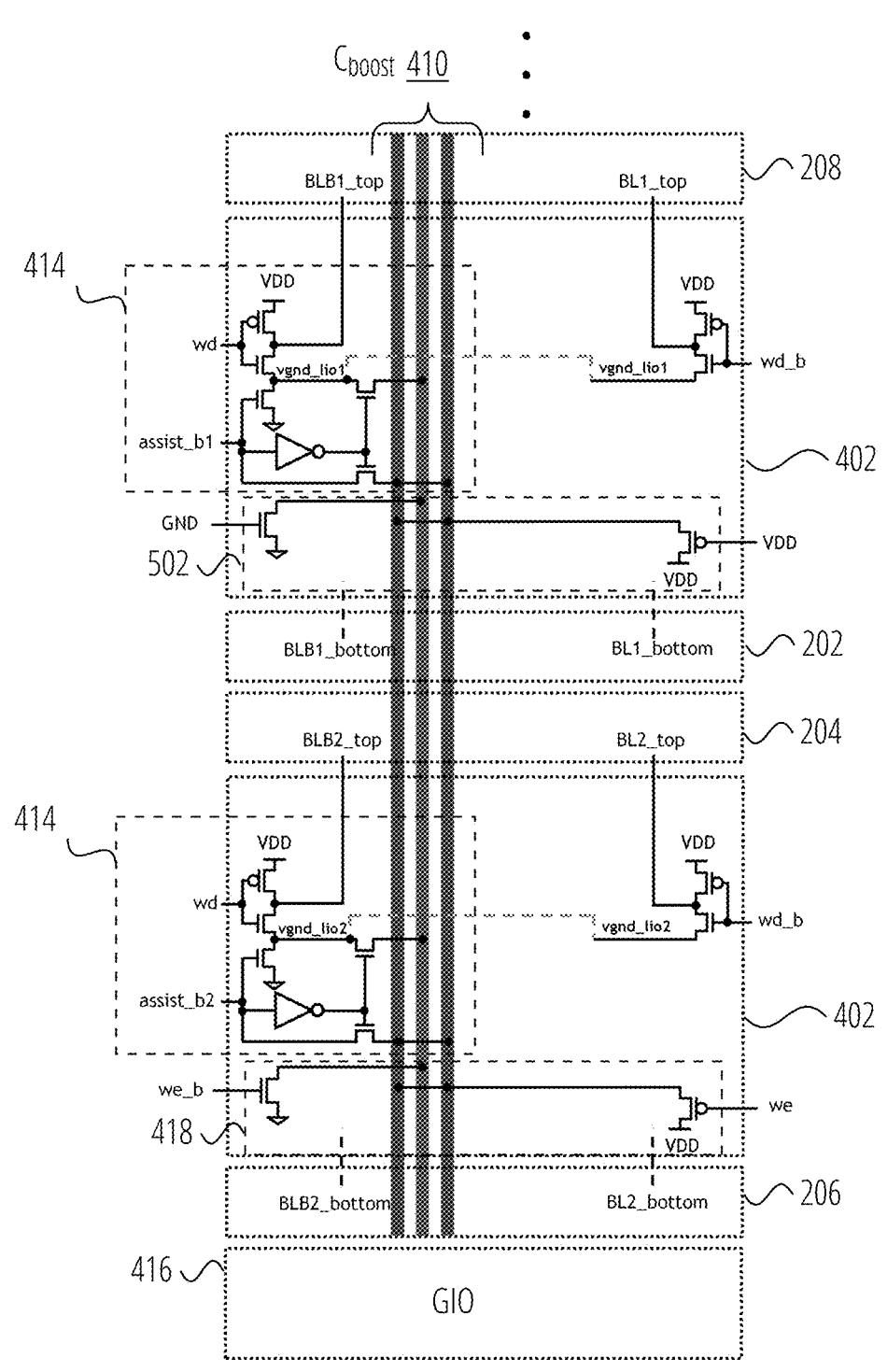
FIG. 5 depicts a memory comprising multiple negative bitline voltage assist circuits utilizing a shared boost capacitor in another embodiment.

FIG. 5 depicts a memory comprising multiple negative bit line voltage assist circuits utilizing a shared boost capacitor in another embodiment. In this embodiment there is a negative bit line voltage assist circuit 414 and 418 disposed in one of the local IO drivers 402. In one of the local IO drivers 402 the pre-charge logic 418 comprises transistors with gates controlled by the write enable (we) signal. Pre-charging of the metal tracks of the boost capacitor 410 for any of the local IO drivers 402 is controlled from the particular local IO driver 402 comprising the pre-charge logic 418. One or more other local IO drivers 402 may comprise dummy logic 502 (not operable for pre-charging the metal tracks). In the dummy logic 502 the gates of the transistors are coupled to GND and VDD respectively. Utilizing the dummy logic 502 may have utility for balancing the design and any parasitic effects along the metal tracks of the boost capacitor 410, for example.

Figure 6:
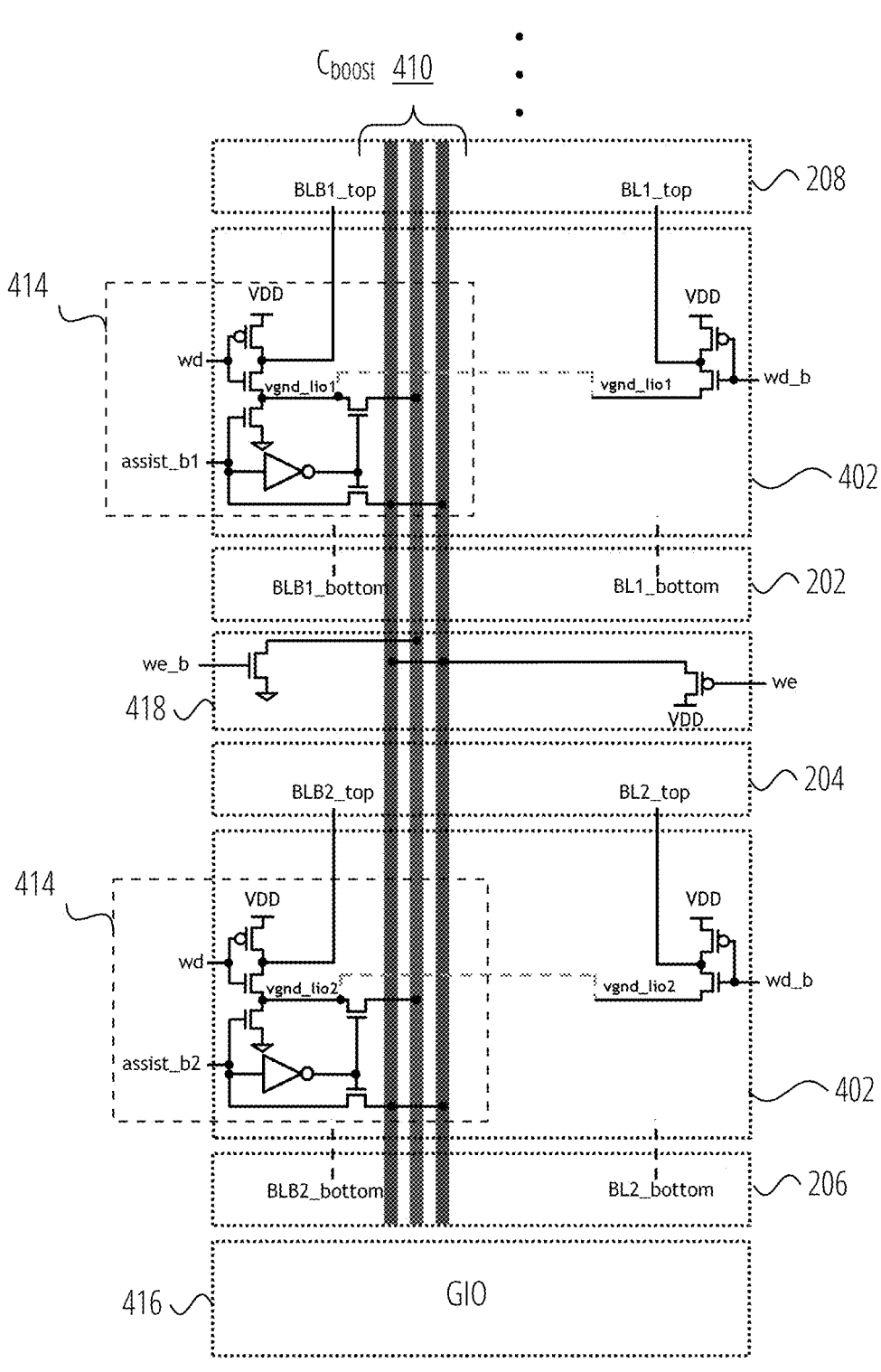
FIG. 6 depicts a memory comprising multiple negative bitline voltage assist circuits utilizing a shared boost capacitor in another embodiment.

FIG. 6 depicts a memory comprising multiple negative bit line voltage assist circuits utilizing a shared boost capacitor in another embodiment. In this embodiment, the negative bit line voltage assist circuits 414 are disposed in the local IO drivers 402, and the pre-charge logic 418 is disposed between the memory banks 202, 204 served by the local IO drivers 402.

Figure 7:
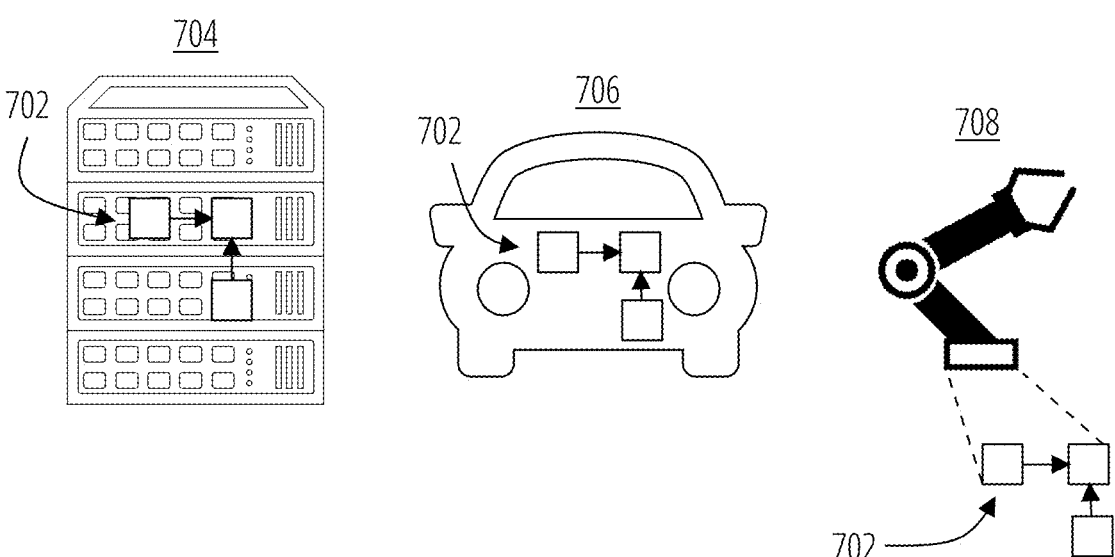
FIG. 7 depicts a memory system 702 in accordance with one embodiment.

FIG. 7 depicts exemplary scenarios for use of a memory system 702 in accordance with some embodiments. A memory system 702 may be utilized in a computing system 704, a vehicle 706, and a robot 708, to name just a few examples. The memory system 702 may comprise a plurality of memory banks, a memory controller, and local IO drivers for the memory banks in accordance with the embodiments described herein, for example.

LISTING OF DRAWING ELEMENTS 102 local IO driver
104 bit-storing cell
106 bit cell access transistor
108 bit line driver
110 transistor
202 bank
204 bank
206 bank
208 bank
210 common IO logic
212 boost capacitor
214 boost capacitor
302

402 local IO driver
404 inverter
406 transistor
408 transistor
410 boost capacitor
412 MOS capacitor
414 negative bit line voltage assist circuit
416 common IO logic
418 pre-charge logic
420 MOS capacitor
422 MOS capacitor
502 dummy logic
702 memory system
704 computing system
706 vehicle
708 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Logic symbols in the drawings should be understood to have their ordinary interpretation in the art in terms of functionality and various structures that may be utilized for their implementation, unless otherwise indicated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112 (f) for that claim element. Accordingly, claims in this application that do not otherwise include the "means for" [performing a function] construct should not be interpreted under 35 U.S.C § 112 (f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A machine memory comprising:
a plurality of memory bank pairs;
a plurality of local input/output (IO) drivers each disposed between a different one of the memory bank pairs;
each local IO driver configured to generate a negative bit line voltage assist on a local bit line local to a different one of the memory bank pairs; and
the local IO drivers configured to share a metal track boost capacitor for the negative bit line voltage assist, the metal track boost capacitor spanning the plurality of memory bank pairs from common IO logic for the memory bank pairs.

2. The machine memory of claim 1, further comprising:
pre-charge logic for the boost capacitor disposed external to the local IO drivers.

3. The machine memory of claim 2, the pre-charge logic disposed between the memory bank pairs.

4. The machine memory of claim 1, further comprising:
pre-charge logic for the boost capacitor disposed within one of the local IO drivers.

5. The machine memory of claim 4, further comprising:
dummy pre-charge logic disposed in other of the local IO drivers than the one local IO driver comprising the pre-charge logic.

6. The machine memory of claim 1, the boost capacitor comprising:
at least one first metal track configured to provide a common ground potential; and
at least one second metal track configured to pre-charge from a supply voltage.

7. The machine memory of claim 6, each local IO driver comprising:
a first transistor configured to selectively couple the local IO driver to the at least one first metal track of the boost capacitor configured to provide the common ground potential; and
a second transistor configured to selectively couple the local IO driver to the at least one second metal track of the boost capacitor configured to pre-charge from the supply voltage.

8. The machine memory of claim 1, the boost capacitor further comprising:
at least one Metal-Oxide-Silicon (MOS) capacitive element.

9. A machine memory comprising:
a first pair of memory banks;
a first bit line driver for a first local bit line local to the first pair of memory banks;
a second pair of memory banks;
a second bit line driver for a second local bit line local to the second pair of memory banks; and
a metal boost capacitor traversing the first and second pairs of memory banks from common IO logic for the first and second pairs of memory banks, the metal boost capacitor configured to generate a negative bit line voltage assist to both of the first bit line driver and the second bit line driver.

10. The machine memory of claim 9, further comprising:

pre-charge logic for the boost capacitor disposed external to the IO drivers.

11. The machine memory of claim 10, the pre-charge logic disposed between the pairs of memory banks.

12. The machine memory of claim 9, further comprising:

pre-charge logic for the boost capacitor disposed within only one of the IO drivers.

13. The machine memory of claim 12, further comprising:

dummy pre-charge logic disposed in the IO driver that does not comprise the pre-charge logic.

14. The machine memory of claim 9, the boost capacitor comprising:

at least one first metal track configured to provide a common ground potential; and at least one second metal track configured to pre-charge from a supply voltage.

15. The machine memory of claim 14, each IO driver comprising:

a first transistor configured to selectively couple the IO driver to the at least one first metal track of the boost capacitor configured to provide the common ground potential; and a second transistor configured to selectively couple the IO driver to the at least one second metal track of the boost capacitor configured to pre-charge from the supply voltage.

16. The machine memory of claim 9, the boost capacitor comprising:

a plurality of metal tracks and at least one Metal-Oxide-Silicon (MOS) capacitive element.

17. A machine memory comprising:

a plurality of memory bank pairs;

a plurality of local input/output (IO) drivers each local to a different one of the memory bank pairs, each configured to share a boost capacitor;

the boost capacitor comprising metal tracks traversing the plurality of memory bank pairs and plurality of local IO drivers from common IO logic for the plurality of memory bank pairs, the boost capacitor configured to generate a negative bit line voltage assist in each of the local IO drivers; and a pre-charge circuit configured to couple at least one first metal track of the boost capacitor to a common ground potential and to couple at least one second metal track of the boost capacitor to a pre-charge voltage potential.

18. The machine memory of claim 17, each local IO driver comprising:

a first transistor configured to selectively couple the local IO driver to the at least one first metal track of the boost capacitor configured to couple to the common ground potential; and a second transistor configured to selectively couple the local IO driver to the at least one second metal track of the boost capacitor configured to couple to the pre-charge voltage potential.

19. The machine memory of claim 17, the boost capacitor further comprising:

at least one Metal-Oxide-Silicon (MOS) capacitive element.

20. The machine memory of claim 1, wherein the metal track boost capacitor consists of three metal tracks.

* * * * *